(12) United States Patent
Paik et al.

(10) Patent No.: US 11,584,973 B2
(45) Date of Patent: Feb. 21, 2023

(54) STEEL SHEET HAVING EXCELLENT IMAGE CLARITY AFTER PAINTING

(71) Applicant: POSCO, Pohang-si (KR)

(72) Inventors: Doo-Jin Paik, Gwangyang-si (KR); Seul-Ki Park, Gwangyang-si (KR); Chung-Won Kim, Gwangyang-si (KR); Jung-Ki Kim, Gwangyang-si (KR); Sung-Il Kim, Gwangyang-si (KR); Hyeon-Seok Hwang, Gwangyang-si (KR); Je-Woong Lee, Gwangyang-si (KR); Jeong-Eun Kim, Gwangyang-si (KR); Cho-Rong Hong, Gwangyang-si (KR)

(73) Assignee: POSCO CO., LTD, Pohang-si (KR)

( * ) Notice: Subject to any disclaimer, the term of this patent is extended or adjusted under 35 U.S.C. 154(b) by 186 days.

(21) Appl. No.: 16/642,630

(22) PCT Filed: Sep. 13, 2018

(86) PCT No.: PCT/KR2018/010750
§ 371 (c)(1),
(2) Date: Feb. 27, 2020

(87) PCT Pub. No.: WO2019/054769
PCT Pub. Date: Mar. 21, 2019

(65) Prior Publication Data
US 2020/0347474 A1    Nov. 5, 2020

(30) Foreign Application Priority Data

Sep. 13, 2017  (KR) .................. 10-2017-0117329
Sep. 13, 2017  (KR) .................. 10-2017-0117343
Dec. 24, 2017  (KR) .................. 10-2017-0178933

(51) Int. Cl.
   *C23C 2/02*  (2006.01)
   *C23C 2/06*  (2006.01)
   (Continued)

(52) U.S. Cl.
   CPC ............... *C21D 9/46* (2013.01); *B32B 15/01* (2013.01); *B32B 15/012* (2013.01);
   (Continued)

(58) Field of Classification Search
   CPC . C21D 1/26; C21D 9/46; C21D 6/005; C21D 6/008; C21D 6/0205; C21D 6/0236;
   (Continued)

(56) References Cited

U.S. PATENT DOCUMENTS

2013/0337287 A1    12/2013  Hirata et al.
2014/0238555 A1*   8/2014   Funakawa ............ C22C 38/22
                                                       148/602

FOREIGN PATENT DOCUMENTS

CA    2826225      9/2012
CN    103990649    8/2014
(Continued)

OTHER PUBLICATIONS

International Search Report—PCT/KR2018/010750 dated Dec. 20, 2018.
(Continued)

*Primary Examiner* — Michael E. La Villa
(74) *Attorney, Agent, or Firm* — Cantor Colburn LLP

(57) ABSTRACT

Provided is a steel sheet having excellent image clarity after painting, including: carbon (C): 0.001% to 0.03%, silicon (Si): 0.001% to 0.35%, manganese (Mn): 0.05% to 2.2%, phosphorus (P): 0.003% to 0.1%, sulfur (S): 0.001% or 0.025%, aluminum (Al): 0.01% to 0.1%, nitrogen (N): 0.001% to 0.007%, and a remainder of iron (Fe) and inevitable impurities. The microstructure of the steel sheet
(Continued)

mainly is ferrite phases. An R-cube texture of a surface layer of the steel sheet is 5% or less by area %.

7 Claims, 4 Drawing Sheets

(51) Int. Cl.
| | |
|---|---|
| C23C 2/12 | (2006.01) |
| C23C 2/40 | (2006.01) |
| C23C 16/06 | (2006.01) |
| B32B 15/01 | (2006.01) |
| C22C 38/14 | (2006.01) |
| C22C 38/12 | (2006.01) |
| C22C 38/06 | (2006.01) |
| C22C 38/04 | (2006.01) |
| C22C 38/02 | (2006.01) |
| C22C 38/00 | (2006.01) |
| C21D 6/00 | (2006.01) |
| C21D 8/02 | (2006.01) |
| C21D 9/46 | (2006.01) |
| C21D 1/26 | (2006.01) |
| C25D 3/22 | (2006.01) |
| C25D 3/44 | (2006.01) |
| C25D 5/36 | (2006.01) |
| C25D 7/06 | (2006.01) |
| C23C 30/00 | (2006.01) |
| B32B 15/18 | (2006.01) |
| B32B 15/04 | (2006.01) |

(52) U.S. Cl.
CPC ............ *B32B 15/013* (2013.01); *B32B 15/04* (2013.01); *B32B 15/043* (2013.01); *B32B 15/18* (2013.01); *C21D 1/26* (2013.01); *C21D 6/005* (2013.01); *C21D 6/008* (2013.01); *C21D 8/0205* (2013.01); *C21D 8/0236* (2013.01); *C21D 8/0263* (2013.01); *C21D 8/0273* (2013.01); *C22C 38/00* (2013.01); *C22C 38/001* (2013.01); *C22C 38/002* (2013.01); *C22C 38/004* (2013.01); *C22C 38/02* (2013.01); *C22C 38/04* (2013.01); *C22C 38/06* (2013.01); *C22C 38/12* (2013.01); *C22C 38/14* (2013.01); *C23C 2/02* (2013.01); *C23C 2/06* (2013.01); *C23C 2/12* (2013.01); *C23C 2/40* (2013.01); *C23C 16/06* (2013.01); *C23C 30/00* (2013.01); *C23C 30/005* (2013.01); *C25D 3/22* (2013.01); *C25D 3/44* (2013.01); *C25D 5/36* (2013.01); *C25D 7/06* (2013.01); *C21D 2201/05* (2013.01); *C21D 2211/005* (2013.01); *C25D 7/0614* (2013.01); *Y10T 428/12757* (2015.01); *Y10T 428/12792* (2015.01); *Y10T 428/12799* (2015.01); *Y10T 428/12951* (2015.01); *Y10T 428/12958* (2015.01); *Y10T 428/12972* (2015.01); *Y10T 428/12993* (2015.01)

(58) Field of Classification Search
CPC .. C21D 6/0263; C21D 6/0273; B32B 15/012; B32B 15/013; B32B 15/01; B32B 15/04; B32B 15/043; B32B 15/18; C22C 38/00; C22C 38/001; C22C 38/002; C22C 38/004; C22C 38/02; C22C 38/04; C22C 38/06; C22C 38/12; C22C 38/14; C23C 30/00; C23C 30/005; C23C 2/02; C23C 2/06; C23C 2/12; C23C 2/40; C23C 16/06; C25D 3/22; C25D 3/44; C25D 5/36; C25D 7/06; C25D 7/0614; C25D 2201/05; C25D 2211/005; Y10T 428/12757; Y10T 428/12792; Y10T 428/12951; Y10T 428/12958; Y10T 428/12972; Y10T 428/12993; Y10T 428/12799

See application file for complete search history.

(56) References Cited

FOREIGN PATENT DOCUMENTS

| | | |
|---|---|---|
| EP | 2554687 | 2/2013 |
| EP | 2880192 | 3/2017 |
| JP | 2008056995 | 3/2008 |
| JP | 2008231447 | 10/2008 |
| JP | 5499664 | 5/2014 |
| JP | 2016156079 | 9/2016 |
| JP | 2017031452 | 2/2017 |
| KR | 19980048456 | 9/1998 |
| KR | 20120073644 | 7/2012 |
| KR | 20140009674 | 1/2014 |
| KR | 20150048554 | 5/2015 |
| KR | 20150072806 | 6/2015 |
| WO | WO 2014/019964 | * 2/2014 |

OTHER PUBLICATIONS

Scheers, et al., Assessment of Steel Surface Roughness and Waviness in Relation with Paint Appearance, Int J. Mach. Tools Manufact., 1998, pp. 647-656.

European Search Report—Application No. 18856660.8 dated May 7, 2020, citing EP 2880192, EP 2554687, JP 2008-056995, KR 10-2012-0073644.

Indian Examination Report—Indian Application No. 202017009067 dated Oct. 4, 2021, citing WO 2014/019964, KR 10-2015-0048554, CA 2826225, and JP 2008-231447.

* cited by examiner (a)          (b)

STEEL SHEET HAVING EXCELLENT IMAGE CLARITY AFTER PAINTING

CROSS-REFERENCE TO RELATED APPLICATIONS

This application is a national entry of PCT Application No. PCT/KR2018/010750 filed on Sep. 13, 2018, which claims priority to and the benefit of Korean Application No. 10-2017-0117329 filed on Sep. 13, 2017; Korean Application No. 10-2017-0117343 filed Sep. 13, 2017; and Korean Application No. 10-2017-0178933 filed Dec. 24, 2017, in the Korean Patent Office, the entire contents of which are incorporated herein by reference.

TECHNICAL FIELD

The present invention relates to a steel sheet used for outer panel materials of automobiles, home appliances, and the like, and relates to a steel sheet which has excellent image clarity after painting and a method for manufacturing the same.

BACKGROUND ART

In general, the cold-rolled steel sheet manufactured in a steel process is excellent in terms of formability, and is widely used as an outer panel material for automobiles, home appliances, etc. due to having a relatively low price as compared to other materials. Such cold-rolled steel sheets are used in a state in which they are mostly coated through a coating process to improve corrosion resistance and secure aesthetics. Accordingly, in order to secure an excellent appearance after painting, research has focused on the technique of coating solutions, coating methods, and the like.

Even in the case of coated steel sheets, however, the appearance quality of the steel sheet may be affected by the surface quality of the steel sheet itself. According to Non-Patent Document 1, the lower the surface roughness (roughness average, Ra) of the steel sheet, the lower the medium wavelength roughness (waviness curve average, Wca). The lower the Wca of the steel sheet, the better the appearance thereof. This is prominent in stochastic rolling process methods such as EDT and short blast. Non-Patent Document 1 somewhat describes the relationship between surface roughness of a material and image clarity thereof, but is silent on relationship between grains of the material and image clarity.

(Non-Patent Document 1) Assessment of steel surface roughness and waviness in relationship with paint appearance. (Int. J. Mach. Tools Manufact. Vol. 38. Nos 5-6, PP. 647-656. 1998)

DISCLOSURE

Technical Problem

An aspect of the present invention is to provide a steel sheet having excellent image clarity secured after painting by controlling a microstructure of the steel sheet and a manufacturing method for the same.

The technical problem of the present invention is not limited to the above. Additional technical problems are disclosed in the overall description of the present invention.

Those skilled in the art would have no difficulty in understanding the additional problems based on the description.

Technical Solution

An aspect of the present invention relates to a steel sheet having excellent image clarity after painting, containing, by wt %: carbon (C) 0.001% to 0.03%, silicon (Si) 0.001% to 0.35%, manganese (Mn) 0.5% to 2.2%, phosphorus (P) 0.003% to 0.1%, sulfur (S): 0.001% or 0.025%, aluminum (Al): 0.01% to 0.1%, nitrogen (N): 0.001% to 0.007%, and a remainder of iron (Fe) and inevitable impurities, wherein a microstructure of the steel sheet mainly consists of ferrite phases, and a {001}<110>texture (R-cube texture) of a surface layer of the steel sheet is 5% or less by area %.

Another aspect of the present invention relates to a method for manufacturing a steel sheet having excellent image clarity after painting, including: heating a slab comprising, by wt %: carbon (C): 0.001% to 0.03%, silicon (Si): 0.001% to 0.35%, manganese (Mn): 0.5% to 2.2%, phosphorus (P): 0.003% to 0.1%, sulfur (S): 0.001% or 0.025%, aluminum (Al): 0.01% to 0.1%, nitrogen (N): 0.001% to 0.007%, and a remainder of iron (Fe) and inevitable impurities; hot-rolling the heated slab to obtain a hot rolled steel sheet; coiling the hot-rolled steel sheet; and cold-rolling the hot-rolled steel sheet to obtain a cold-rolled steel sheet, wherein rolling oil is sprayed at a rate of 400 cc/min to 1000 cc/min during the hot-rolling.

Advantageous Effects

The steel sheet of the present invention can have effects of fine steel sheet appearance and excellent image clarity even when subject to conventional painting or thin film painting. Further, due to refinement and uniformity of a microstructure of the steel sheet, formability may improve and a cost incurring from formation defects.

BRIEF DESCRIPTIONS OF DRAWINGS

BEST MODE

Figure 1:
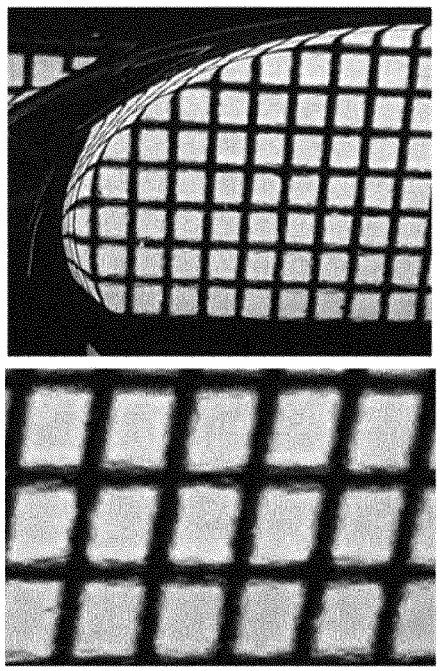
FIG. 1 is photographic images of image clarity of Comparative Example 1 and image clarity of Inventive Example, compared with naked eye.
Figure 1:
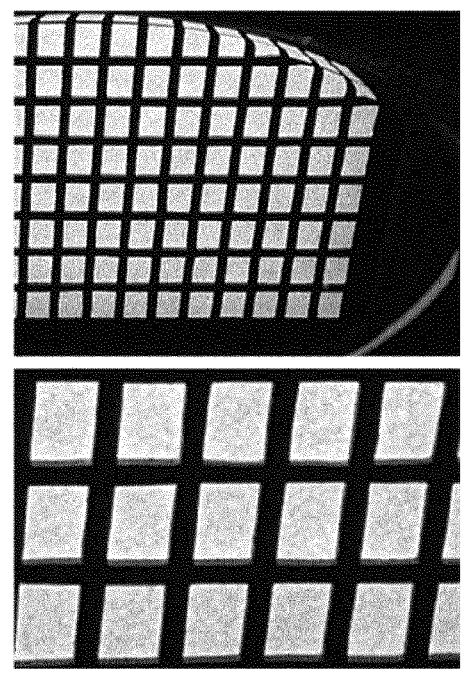

Hereinbelow, the steel sheet of the present invention will be described in detail.

A composition of the steel sheet will be described in detail. It is preferable that the steel sheet of the present invention contain, by weight % (hereinafter, indicated as "%"), carbon (C): 0.001% to 0.03%, silicon (Si): 0.001% to 0.35%, manganese (Mn): 0.5% to 2.2%, phosphorus (P): 0.003% to 0.1%, sulfur (S): 0.001% or 0.025%, aluminum (Al): 0.01% to 0.1% and nitrogen (N): 0.001% to 0.007%.

C: 0.001% to 0.03%

When a content of C is less than 0.001%, grains of the hot-rolled sheet become coarse, thereby lowering strength and increasing planar anisotropy, whereas a content of C exceeding 0.03% increases an amount of solid C in the steel, thereby making it difficult to secure aging resistance and lowering ductility despite increased strength due to solid strengthening. It is preferable that C be included in an amount of 0.001% to 0.03%, more preferably 0.002% to 0.015%.

Si: 0.001% to 0.35%

Si is a solid-strengthening element in a steel and is thus advantageous in securing strength. When a content of S is less than 0.001%, there is almost no effect of improved strength. In contrast, a content of S greater than 0.35% causes not only surface scale defects during the hot-rolling but also a ferrite stable region to widen, which may lead to two-phase region rolling during the hot-rolling, thereby forming a non-uniform microstructure. Accordingly, it is preferable that a content of Si be 0.001% to 0.35%, more preferably 0.01% to 0.3%.

Mn: 0.05% to 2.2%

Similarly to Si, Mn is an element effective in solid strengthening. For such effect, it is preferable that Mn be contained in an amount of 0.05% or more. When a content of Mn is less than 0.05%, the strength improvement effect is insignificant and high temperature ductility is reduced. In contrast, when a content of Mn exceeds 2.2%, plastic anisotropy increases, and an amount of surface layer oxides increases during annealing, thereby giving rise to reduced plating characteristics. Accordingly, it is preferable that a content of Mn be 0.05% to 2.2%, more preferably, 0.1% to 0.8%.

S: 0.001% or 0.025%

Sulfur (S) is an impurity present in steel. When a content of S exceeds 0.025%, S combines with Mn, or the like, and forms a non-metallic inclusion, which is disadvantageous in formability and may readily cause minute cracking when the steel is cut. However, an excessive amount of time is required to manufacture a steel containing S in an amount less than 0.001%, thereby reducing productivity. Accordingly, it is preferable that a content of S be 0.001% to 0.025%.

Al: 0.01% to 0.1%

Aluminum (Al) is an ingredient added as a deoxidizer, and combines with nitrogen in a steel to form AlN precipitates, thereby improving aging resistance. When a content of Al is less than 0.01%, such effect is insufficient. In contrast, a content of Al greater than 0.1% causes formation of AlN precipitates, which may cause defects of a slab during continuous casting. Accordingly, it is preferable that a content of Al be 0.01% to 0.1%.

N: 0.001% to 0.007%

N is an element inevitably added for steelmaking and has a significant effect of solid strengthening. N also combines with Ti, Al, or the like, to form coarse precipitates. When a content of N exceeds 0.007%, aging resistance characteristics deteriorate due to an increased amount of solid N. To manufacture a steel to contain N in an amount of less than 0.001%, productivity decreases during steelmaking. Accordingly, it is preferable that a content of Al be 0.001% to 0.007%.

P: 0.003% to 0.1%

P (phosphorus) is a representative solid-strengthening element inevitably added to enhance strength; however, P causes brittleness due to grain boundary segregation, resulting in deteriorated impact resistance. To obtain such strengthening effect, at least 0.033% of P needs to be contained. When a content of P exceeds 0.1%, however, the brittleness of the steel greatly increases along with a drastic decrease in elongation. To control the content of P to be less than 0.003%, manufacturing costs may be excessively increased, and thus is economically disadvantageous. Accordingly, it is preferable that a content of P be 0.003% to 0.1%.

In addition to the above, the steel sheet may contain at least one selected from the group consisting of niobium (Nb): 0.005% to 0.03% and titanium (Ti): 0.005% to 0.10%.

The Nb serves to precipitate carbon and prevent aging due to solid carbon. When an amount of Nb is less than 0.005%, an amount of solid carbon is high, thereby making it difficult to prevent aging, whereas an amount of Nb exceeding 0.03% increases strength, thereby deteriorating hot rolling formability of a ferrite steel sheet. Strength of a final product also increases, which makes it disadvantageous in molding. Accordingly, it is preferable that the Nb be contained in an amount of 0.005% to 0.03%.

The Ti is added to secure non-aging and improve moldability. Ti, as an element producing strong nitrides and carbides, is added to a steel and precipitates TiN and TiC precipitates, thereby precipitating solid nitrogen and solid carbon and obtaining non-aging. When an amount of Ti is less than 0.005%, an amount of the TiC precipitates may be too low, thereby making it difficult to secure said effect. When more than 0.10% of Ti is added, a size of the TiC precipitates increases due to formation of coarse TiN, thereby deteriorating moldability and significantly lowering plating characteristics. Accordingly, it is preferable that the Ti be contained in an amount of 0.005% to 0.06%.

In addition to the above ingredients, Fe and inevitable impurities are contained. However, the addition of other alloying elements is not excluded as long as it does not depart from the technical concept of the present invention.

It is preferable that the steel sheet mainly consist of ferrite phases. That is, the steel sheet of the present invention contains 95% or more of the ferrite phases by area %, preferably has a ferrite single phase texture.

It is preferable that an average grain size of the steel sheet surface layer be 30 μm or less. A surface layer of the steel sheet may preferably refer to 1/16, more preferably 1/32, of a thickness of the steel sheet from a surface of the steel sheet. When an average grain size of the steel sheet surface layer is coarse due to exceeding 30 μm, non-uniformity of the texture increases during formation, thereby deteriorating moldability. Further, long wavelength roughness (Wca or Wa) may increase, resulting in deteriorated image clarity after painting. Meanwhile, when the average size of the grain is reduced, it is more advantageous in terms of image clarity; however, it requires excessive amounts of alloy components to be added or reductions to be increased in order to have a small average size of the grain. The strength and ductility may greatly change depending on the average grain size. Accordingly, it is preferable that the average of the grain be 1 μm or greater.

It is preferable that in the surface layer, a ratio of an area fraction of a grain having a grain size of 10 μm or less to an area fraction of a grain having a grain size of 30 μm or more (area fraction of a grain having a grain size of 10 μm or less to area fraction of a grain having a grain size of 30 μm or more) be 0.5 or above. When the ratio of an area fraction of a grain having a grain size of 10 μm or less to an area fraction of a grain having a grain size of 30 μm or more is less than 0.5, moldability deteriorates, and image clarity may deteriorate due to the non-uniform texture.

It is preferable that in the surface layer, the standard deviation of grain size is 8 or less.

It is preferable that in the surface layer, an area fraction of a grain having an aspect ratio of 0.3 or less account for 15% or less. When the grain having an aspect ratio of 0.3 or less accounts for more than 15%, image clarity may deteriorate due to the non-uniform microstructure of the surface layer.

It is preferable that the {001}<110>texture (rotated-cube texture) of a surface layer of the steel sheet be 5.0 area % or less. As an example, the area fraction of the rotated-cube texture can be analyzed by electron backscatter diffraction (EBSD).

The {001}<110>texture (rotated-cube texture; R-cube texture) is the most stable texture among textures formed during cold-rolling and has a lowest plastic anisotropy coefficient (r) value among the textures. In addition, the R-cube texture is the most stable in terms of energy and thus is not subject to recrystallization when annealing.

Formation of a texture (γ-fiber texture, grains whose vertical direction of a rolling direction is parallel to surface <111>) increases a plastic anisotropy coefficient to have excellent Drawability; however, the presence of the R-cube texture in the steel sheet surface layer is important for image clarity. Accordingly, when the R-cube texture exceeds 5.0 area % in the surface layer, clusters of the R-cube are exhibited on the surface of the steel sheet due to rolling, passing, tension, or the like, and curvature of the surface texture is visually recognized, resulting in deteriorated image clarity.

The steel sheet of the present invention have a long wavelength roughness Wa of preferably 0.5 µm or less, more preferably 0.45 µm or less.

Meanwhile, the steel sheet of the present invention may be a coated steel sheet containing a coating layer. A type of the coated steel sheet is not limited, and may be an Al-base coated steel sheet, a Zn-base coated (GI or GA) steel sheet and a Zn—Al—Mg-base alloy-coated steel sheet. In terms of methods, EG plating, hot dip plating, and the like, may be applied.

Hereinbelow, a method for manufacturing the steel sheet of the present invention will be described in detail. To manufacture the steel sheet, a steel slab satisfying the alloy composition of steel above is heated and hot-rolled. Additionally, the hot-rolled steel sheet may be cold-rolled. Each process will be described in detail.

A steel slab satisfying the above alloy composition of steel is prepared and heated. Heating of the steel slab may be performed by a method conventionally used in the art. As a preferred example, it is preferable that the heating be performed for 100 min to 300 min at 1100° C. to 1300° C. for texture uniformity. When the heating temperature is lower than 1100° C., texture uniformity may be insufficient and coarse carbides and nitrides may not be re-solidified, which may be disadvantageous in moldability of steel, whereas when the heating temperature exceeds 1300° C., a non-uniform microstructure may be formed due to grain growth. When a heating time is less than 100 minutes, a deep portion of the slab may not be heated at a uniform temperature, whereas when the heating time is over 300 minutes, grains may grow excessively and it is not economically preferable.

The heated steel slab is hot-rolled.

It is preferable that the hot-rolling be performed in a temperature range of 850° C. to 1150° C. When the rolling temperature is higher than 1150° C., a temperature of the hot-rolled steel sheet increases, thereby making the grain coarse and deteriorating surface quality of the hot-rolled steel sheet. In contrast, when the hot-rolling is completed at a temperature lower than 850° C., elongated grains develop due to excessive recrystallization delay, which gives rise to high anisotropy and deteriorated moldability. In this regard, the surface layer is subject to two-phase (ferrite+austenite) rolled to develop a non-uniform microstructure.

It is preferable that rolling oil be sprayed at a rate of 400 cc/min to 1000 cc/min during the hot-rolling to perform oil-rolling. Formation of an oil film on the surface of a rolling roll via oil-rolling is advantageous in improving the surface quality of the steel sheet due to a reduced frictional coefficient and in forming a microstructure, which is uniform from the surface layer to the deep portion, due to reduced shear deformation of the surface layer. When the rolling oil is oil-rolled at less than 400 cc/min, it is difficult to expect the above effect. A rate exceeding 1000 cc/min causes slip during rolling, and deteriorating passability and causing defects. It is also economically disadvantageous.

It is conventional that as a hot-rolling temperature decreases, grains become finer and have a uniform microstructure. However, when the temperature is further reduced, friction between the rolling rolls and the hot-rolled sheet increases, thereby increasing shear deformation in the surface layer and giving rise to a non-uniform texture in a thickness direction. When the rolling temperature decreases below a phase-transformation temperature, the steel sheet is subject to two-phase rolling, and the microstructure of the surface layer becomes significantly non-uniform. Accordingly, adequate oil-rolling alleviates shear deformation of the surface layer and lowers a phase transformation temperature of the surface layer, even when the rolling temperature decreases. As a result, the oil-rolling, when performed as described above, may narrow a temperature range in which shear deformation occurs, which enables the texture to be formed to be fine and uniform at an appropriate rolling temperature.

The rolled steel sheet is cooled. It is preferable that the cooling be performed to 500° C. to 750° C. at an average cooling rate of 10° C./sec to 100° C./sec. Coiling is then performed after cooling to 500° C. to 750° C. Preferably, the coiling is performed after cooling to 600° C. to 700° C. When the coiling is performed after cooling to a temperature lower than 500° C., a low-temperature ferrite phase become unnecessary, strength of the hot-rolled steel sheet increases, thereby increasing a rolling load and deteriorating passability when cold-rolling. In contrast, when the coiling is performed after cooling to a temperature above 750° C., ferrite grains are formed, which gives rise to a non-uniform microstructure, and thus it is not preferred. When an average cooling rate is less than 10° C./sec, the grains of a matrix structure become coarse, and the microstructure becomes non-uniform. When an average cooling rate is greater than 100° C./sec, the low-temperature ferrite phase is readily formed, and a shape of the rolled sheet becomes inferior.

The coiled steel sheet is then cooled to a room temperature via a conventional method in the art. As an example, the cooling is performed 0.001° C./sec to 100° C./sec via air-cooling or water-cooling. When the cooling rate is less than 0.001° C./sec, grain may grow due to the slow cooling rate, and the productivity decreases when manufacturing the steel sheet. In contrast, when the cooling rate exceeds 100° C./sec, it may be difficult to uniformly cool an entire coil, thereby causing a non-uniform microstructure of the coil.

The hot-rolled steel sheet may be cold-rolled. It is preferable that the cold-rolling be performed at a reduction rate of 60% to 90% by pickling the hot-rolled steel sheet to remove scales attached to the surface. When the reduction rate is less than 60%, recrystallization is formed during annealing, and sufficient deformation energy cannot be obtained, resulting in a non-uniform microstructure and deteriorated moldability. There is no limitation on an upper limit of the cold-rolling reduction rate; however, when the reduction rate is greater than 90%, shape quality of the rolled sheet deteriorates during cold-rolling. In this regard, a reduction rate of 90% or less is preferred.

Annealing may be performed at 700° C. to 900° C. after cold-rolling.

In the meantime, coating may be performed after cold-rolling to manufacture a coated steel sheet. A type of the coating is not particularly limited, and any coating used in the art can be applied. Al-base coating, hot dip galvanized coating (GI), Zn-base coating such as alloyed hot dip galvanized coating (GA), and Zn—Al—Mg-base alloy coating may be applied. In terms of methods thereof, electroplating, hot dip plating, vacuum deposition, or the like, may be applied. The annealed steel sheet is immersed in a Zn-plating bath and allowed to pass therethrough, followed by cooling at 5° C./sec to 50° C./sec. Rough rolling may then be performed to improve roughness, shape correction and yield point elongation.

MODE FOR INVENTION

Hereinafter, the present invention will be described in more detail with reference to the Examples. However, the following Examples are merely for describing the present invention and do not limit the present invention.

Examples

A steel slab having the composition as shown in Table 1 below is prepared, and a cold-rolled steel sheet was manufactured under the conditions shown in Table 1 below. A result of analysis thereof is shown in Table 3. A unit of the composition of Table 1 is wt %, and a remainder composition of Table 1 includes Fe and inevitable impurities. The hot-rolled steel sheets manufactured by the process of Table 2 have a thickness of 3.2 mm, a length and a width of 1200 mm. At a rolling rate of 700 mpm to 800 mpm, the steel sheet was manufactured uniformly.

TABLE 1

| Type | C | Si | Mn | P | S | Al | N | Nb | Ti |
|---|---|---|---|---|---|---|---|---|---|
| Steel 1 | 0.002 | 0.010 | 0.08 | 0.009 | 0.003 | 0.03 | 0.003 | 0.009 | 0.029 |
| Steel 2 | 0.003 | 0.002 | 0.07 | 0.009 | 0.004 | 0.03 | 0.003 | 0.001 | 0.046 |
| Steel 3 | 0.002 | 0.028 | 0.14 | 0.018 | 0.01 | 0.03 | 0.003 | 0.003 | 0.001 |

In Table 1 above, Nb of Steel 2 and that of Steel 3 are not particularly managed but are inevitably contained in an infinitesimal amount.

TABLE 2

| Type | Steel | Slab heating temp (° C.) | Slab heating time (min) | Hot-rolling temp (° C.) | Amount of sprayed rolling oils(cc/min) | Coiling temp (° C.) | Cold-rolling reduction rate(%) |
|---|---|---|---|---|---|---|---|
| IE 1 | Steel 1 | 1176 | 171 | 920 | 600 | 720 | 78 |
| CE 1 | Steel 1 | 1180 | 150 | 890 | — | 720 | 78 |
| IE 2 | Steel 1 | 1192 | 177 | 923 | 800 | 720 | 78 |
| CE 2 | Steel 1 | 1178 | 145 | 880 | 1200 | 720 | 78 |
| IE 3 | Steel 1 | 1182 | 184 | 920 | 650 | 720 | 78 |
| CE 3 | Steel 1 | 1185 | 158 | 885 | — | 720 | 78 |
| IE 4 | Steel 2 | 1177 | 179 | 920 | 850 | 700 | 79 |
| CE 4 | Steel 2 | 1178 | 149 | 890 | — | 700 | 79 |
| IE 5 | Steel 2 | 1184 | 173 | 923 | 600 | 700 | 79 |
| CE 5 | Steel 2 | 1182 | 149 | 880 | 250 | 700 | 79 |
| IE 6 | Steel 2 | 1182 | 169 | 920 | 750 | 700 | 79 |
| CE 6 | Steel 2 | 1178 | 157 | 885 | 300 | 700 | 79 |
| IE 7 | Steel 3 | 1180 | 166 | 920 | 650 | 620 | 80 |
| CE 7 | Steel 3 | 1177 | 148 | 890 | 300 | 620 | 80 |
| IE 8 | Steel 3 | 1178 | 178 | 923 | 700 | 620 | 80 |
| CE 8 | Steel 3 | 1181 | 148 | 880 | 350 | 620 | 80 |
| IE 9 | Steel 3 | 1171 | 172 | 920 | 850 | 620 | 80 |
| CE 9 | Steel 3 | 1175 | 156 | 885 | — | 620 | 80 |

*IE: Inventive Example
**CE: Comparative Example

For Inventive Examples and Comparative Examples manufactured as shown in Table 2 above, area fraction of the {001}<110>texture (Rotated-cube texture; R-cube texture) was calculated using Electron Back Scattered Diffraction (EBSD).

For Inventive Examples and Comparative Examples manufactured as shown in Table 2 above, an area fraction of a {001}<110>texture (a rotated-cube (R-cube) texture) was calculated with respect to texture, in detail, an R-cube texture of a surface layer portion of each specimen using electron back scattered diffraction (EBSD).

Further, a ratio of an area fraction of a grain having a grain size of 10 μm or less to an area fraction of a grain having a grain size of 30 μm or more (an area fraction of a grain having a grain size of 10 μm or less to an area fraction of a grain having a grain size of 30 μm or more) of the surface layer was also calculated. Further, an area fraction of a grain having an aspect ratio of 0.3 or less was calculated.

In addition, each sample was measured in terms of surface Wa values after processing (about 5% of stretching in a biaxial tensile strain state).

The result thereof is shown in Table 3.

TABLE 3

| Type | Surface layer R-cube texture area fraction (%) | Surface layer grain average size (μm) | A ratio of an area fraction of (grain having a size of 10 μm or less to an area fraction of grain having a size of 30 μm or more) on the surface layer | Area fraction of grain having an aspect ratio of 0.3 or less (%) | Wa (μm) |
|---|---|---|---|---|---|
| IE 1 | 4.5 | 20.3 | 0.70 | 11.0 | 0.30 |
| IE 2 | 4.6 | 19.4 | 0.60 | 10.2 | 0.27 |
| IE 3 | 4.7 | 20.6 | 0.63 | 13.8 | 0.36 |
| IE 4 | 4.6 | 20.2 | 0.93 | 12.7 | 0.27 |
| IE 5 | 4.5 | 25.3 | 0.96 | 15.0 | 0.41 |
| IE 6 | 4.9 | 23.5 | 0.61 | 13.6 | 0.26 |
| IE 7 | 4.7 | 17.8 | 0.54 | 9.7 | 0.41 |
| IE 8 | 4.5 | 17.5 | 0.78 | 9.8 | 0.24 |
| IE 9 | 4.2 | 18.0 | 0.84 | 11.5 | 0.23 |
| CE 1 | 6.1 | 33.2 | 0.25 | 17.1 | 0.56 |
| CE 2 | 5.9 | 35.0 | 0.53 | 17.7 | 0.49 |
| CE 3 | 4.7 | 32.0 | 0.28 | 17.4 | 0.63 |
| CE 4 | 6.3 | 30.4 | 0.39 | 14.9 | 0.61 |
| CE 5 | 6.5 | 36.1 | 0.41 | 14.4 | 0.54 |
| CE 6 | 5.9 | 31.4 | 0.18 | 16.0 | 0.55 |
| CE 7 | 6.5 | 23.9 | 0.33 | 17.3 | 0.60 |
| CE 8 | 7.5 | 22.6 | 0.14 | 15.4 | 0.50 |
| CE 9 | 6.2 | 22.4 | 0.24 | 17.5 | 0.59 |

Figure 2:
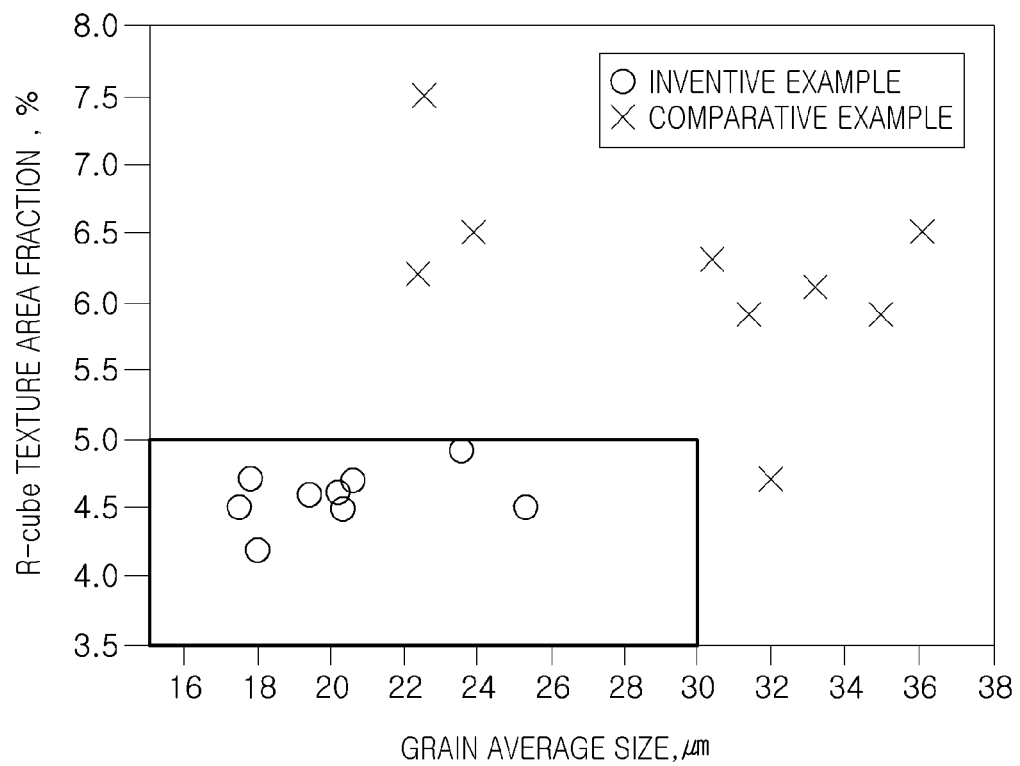
FIG. 2 is a graph illustrating relationship of a grain size of a surface layer to a fraction of an R-cube texture of the Inventive Example and that of the Comparative Example.

Meanwhile, FIG. 1 illustrate a result of comparison of clarity using a grid and a light source to compare surfaces with naked eye. The cold-rolled steel sheets of Comparative Example 1 (FIG. 1(a)) and Inventive Example 1 (FIG. 1(b)) were coated after being subject to about 50 of stretching in a biaxial tensile strain state. The result of FIG. 1 shows that clarity of Inventive Example 1 is higher than that of Comparative Example 1. FIG. 2 is a graph illustrating relationship of a grain size of a surface layer to a fraction of an R-cube texture of Inventive Example and that of Comparative Example. All Inventive Examples are shown to secure uniform crystals in the surface layer, which indicates that the R-cube texture, too, satisfied the scope of the present invention.

Figure 3:
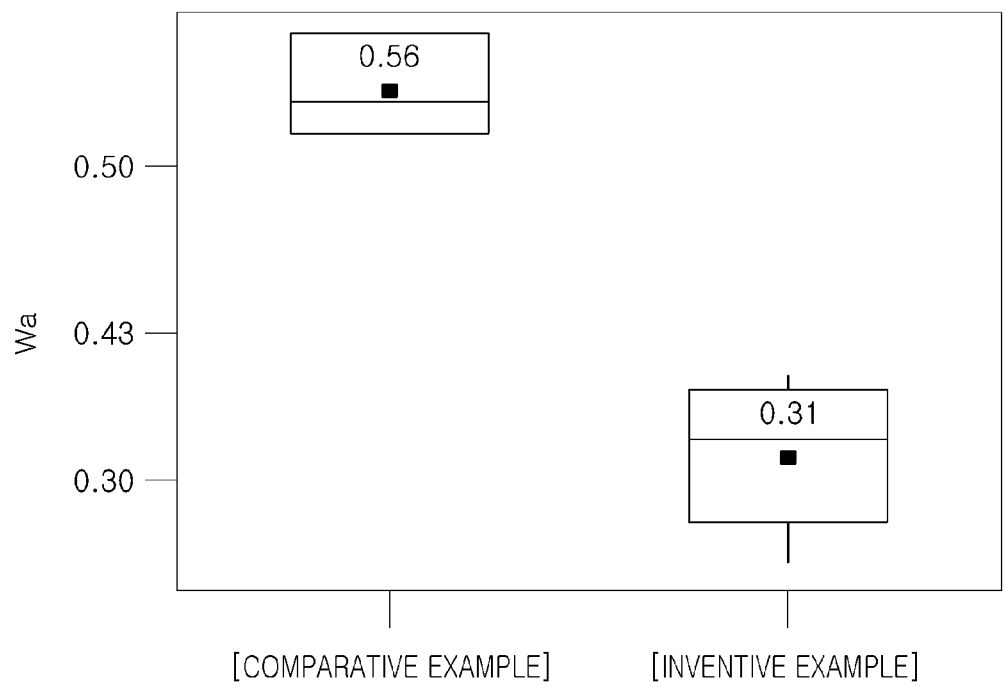
FIG. 3 is a graph illustrating Wa distributions of the Inventive Example and the Comparative Example.

FIG. 3 illustrates average a Wa value and a deviations thereof for the cold-rolled steel sheet of Inventive Examples and those of Comparative Examples. The Wa measurement was performed using a medium wavelength roughness measuring equipment after about 5% stretching in a biaxial tensile strain state. As illustrated in FIG. 3, compared to Comparative Examples, Inventive Examples have lower Wa values and thus have more excellent image clarity.

Figure 4:
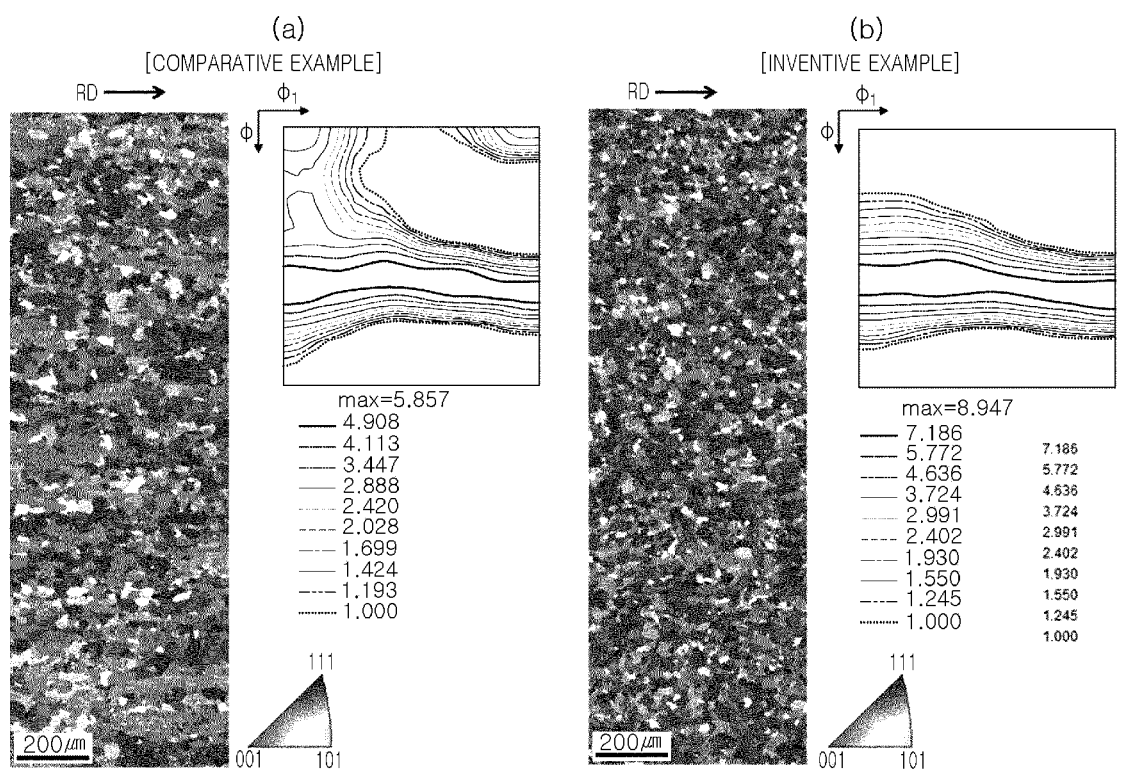
FIG. 4 illustrates electron backscatter diffraction (EBSD) results of Comparative Example 1 and Inventive Example 1.

Meanwhile, FIG. 4 area fraction calculations of the R-cube texture of the surface layer, analyzed by electron backscatter diffraction (EBSD) for Comparative Example 1 and Inventive Example 1. Comparative Example 1 showed 6.1% while Inventive Example 1 showed 4.5%.

The result of Table 3 and the drawings describe that excellent image clarity can be obtained when satisfying the requirements of the present invention.

The invention claimed is:

1. A steel sheet having excellent image clarity after painting, the steel sheet comprising, by wt %:
    carbon (C): 0.001% to 0.03%, silicon (Si): 0.001% to 0.35%, manganese (Mn): 0.05% to 2.2%, phosphorus (P): 0.003% to 0.1%, sulfur (S): 0.001% or 0.025%, aluminum (Al): 0.01% to 0.1%, nitrogen (N): 0.001% to 0.007%, and a remainder of iron (Fe) and inevitable impurities,
    wherein a microstructure of the steel sheet comprises 95% or more of ferrite phases by area %, and
    an R-cube texture of a surface layer of the steel sheet is 5% or less by area %, wherein the surface layer is defined by an area from a surface of the steel sheet to a predetermined position in a thickness direction of the steel sheet.

2. The steel sheet of claim 1, wherein the steel sheet further comprises at least one selected from the group consisting of niobium (Nb): 0.005% to 0.03% and titanium (Ti): 0.005% to 0.10%.

3. The steel sheet of claim 1, wherein an average grain size of the surface layer is 30 μm or less.

4. The steel sheet of claim 1, wherein a standard deviation of grain size of the surface layer is 8 μm or less.

5. The steel sheet of claim 1, wherein, in the surface layer, a ratio of a first area fraction of a grain having a grain size of 10 μm or less to a second area fraction of a grain having a grain size of 30 μm or more is 0.5 or above, and
    wherein the first area fraction and the second area fraction represent an area fraction measured in a given observable field/cross-section of the surface layer using an electron back scattered diffraction method.

6. The steel sheet of claim 1, wherein, in the surface layer, an area fraction of a grain having an aspect ratio of 0.3 or less accounts for 15% or less, and
    wherein the area fraction represents an area fraction measured in a given observable field/cross-section of the surface layer using an electron back scattered diffraction method.

7. The steel sheet of claim 1, wherein the steel sheet further comprises a coating layer on the surface thereof,
    wherein the coating layer is one of an Al-based coating layer, a Zn-based coating layer and a Zn—Al—Mg alloy-based coating layer.

* * * * *